United States Patent
Barsun et al.

(12) 
(10) Patent No.: US 7,567,438 B1
(45) Date of Patent: Jul. 28, 2009

(54) HEAT SINK WITH PRECOMPRESSED BIAS MEMBER

(75) Inventors: Stephan Karl Barsun, Davis, CA (US); Shaun L Harris, McKinney, TX (US); Brandon Rubenstein, Loveland, CA (US); Brent Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/151,763

(22) Filed: Jun. 14, 2005

(51) Int. Cl.
*H05K 7/20* (2006.01)
(52) U.S. Cl. ....................... 361/709; 361/804
(58) Field of Classification Search ................. 361/803, 361/804, 728, 810, 709; 257/690–692; 439/71, 439/74
See application file for complete search history.

(56) References Cited

U.S. PATENT DOCUMENTS

| | | | |
|---|---|---|---|
| 5,323,133 A | 6/1994 | Heath et al. | |
| 6,219,238 B1 * | 4/2001 | Andros et al. | 361/704 |
| 6,222,734 B1 | 4/2001 | Bookhardt et al. | |
| 6,472,742 B1 | 10/2002 | Bhatia et al. | |
| 6,492,187 B1 | 12/2002 | Farnworth et al. | |
| 6,549,418 B1 * | 4/2003 | Deeney | 361/736 |
| 6,552,905 B2 | 4/2003 | Herring et al. | |
| 6,627,980 B2 | 9/2003 | Eldridge | |
| 6,704,195 B2 | 3/2004 | Cravens et al. | |
| 6,731,505 B1 * | 5/2004 | Goodwin et al. | 361/719 |
| 6,786,739 B2 | 9/2004 | Frutschy et al. | |
| 6,789,312 B2 | 9/2004 | White | |
| 2002/0196614 A1 * | 12/2002 | DiBene et al. | 361/803 |
| 2005/0212120 A1 * | 9/2005 | Tran | 257/712 |

* cited by examiner

*Primary Examiner*—Dean A. Reichard
*Assistant Examiner*—Yuriy Semenenko

(57) ABSTRACT

A subassembly of an apparatus, in one example, includes a first body member and a bias member. A fastener extending through the subassembly applies a compression force to the subassembly. A precompression member is engageable with the subassembly and the bias member so as to impart a precompression force to the bias member. In one example, the fastener is a screw engageable with a threaded plate and biased by a leaf spring which is precompressed to facilitate initial engagement of the screw and the threaded plate.

25 Claims, 3 Drawing Sheets

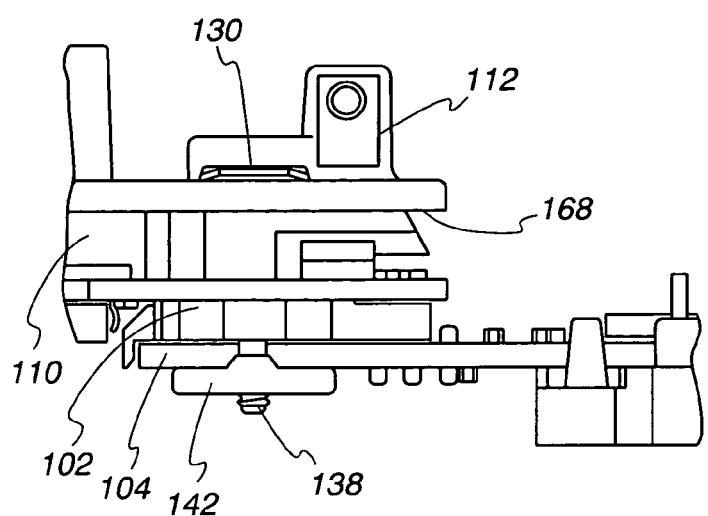
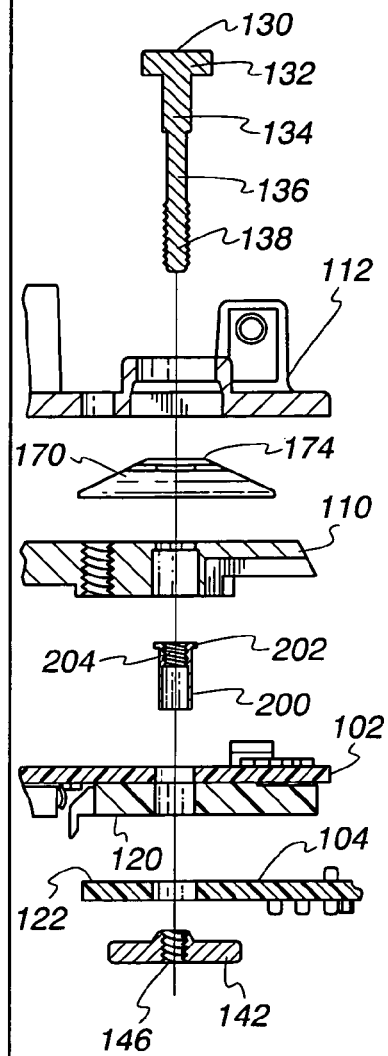
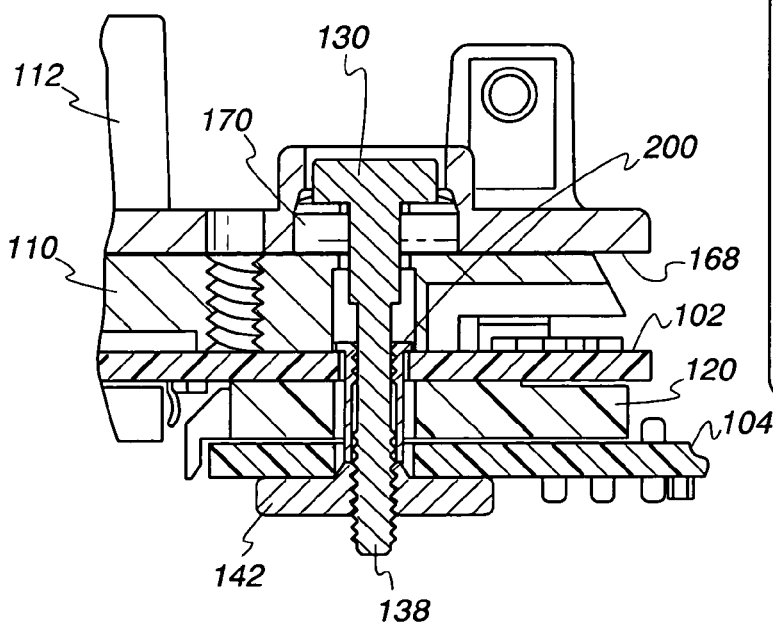

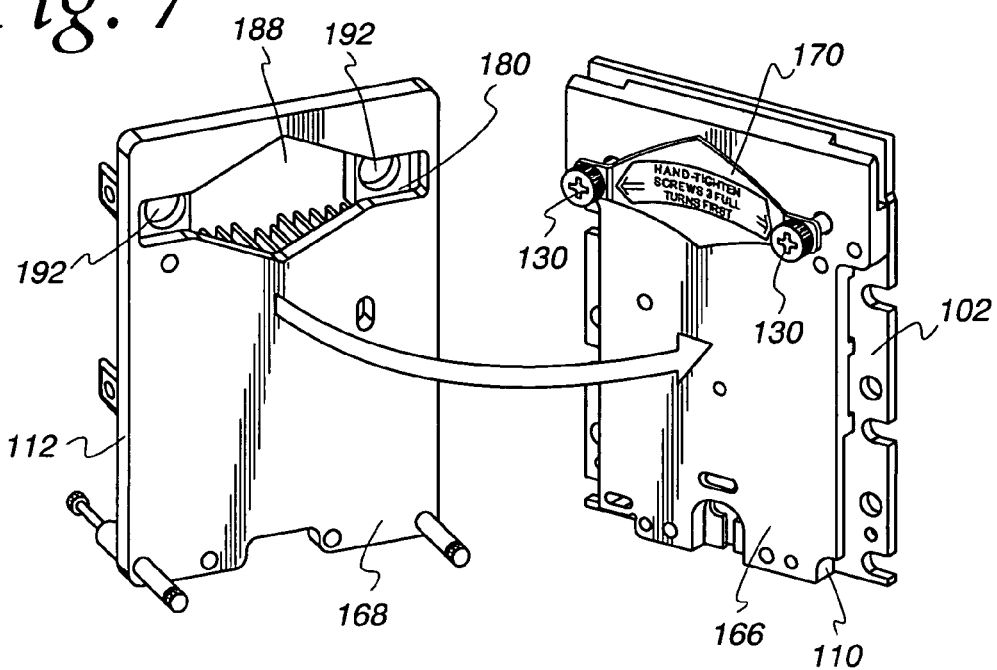
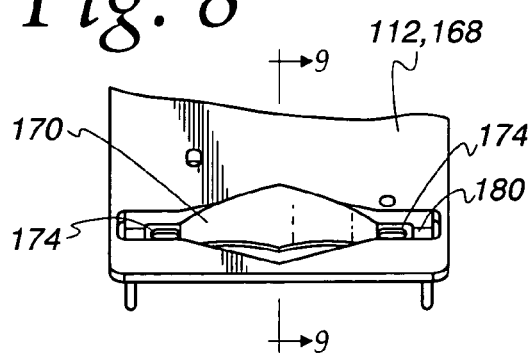
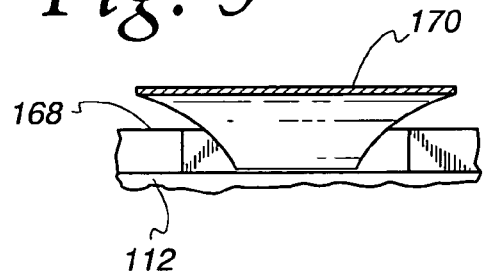
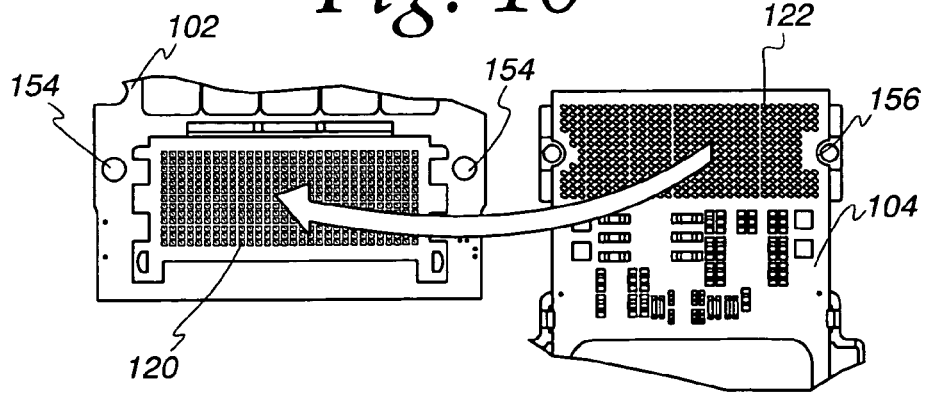

HEAT SINK WITH PRECOMPRESSED BIAS MEMBER

BACKGROUND

Computing systems and other electronic and electrical devices utilize components that generate a substantial amount of heat during their operation. Higher integrated circuit die densities and increased integrated circuit speeds combine to increase the operational speed of computers and other electronic devices. Along with increased density and speed of integrated circuit devices comes increased power consumption. In addition to the problem of increased heat dissipation, integrated circuits are becoming increasingly smaller in size. Thus, the amount of heat to be dissipated per unit area increases at substantial rates. Heat is typically conducted away from integrated circuit devices through the packages in which they are carried. In one design, the surface of the integrated circuit device is thermally coupled to its surrounding package to enhance the heat flow from integrated circuit device.

Complex electronic equipment, such as computers frequently employ a number of relatively massive components such as heat sinks and voltage regulators. With increased computational power, these types of components have ever growing operational capacities, with an attendant increase in weight. With increasing miniaturization, demands on assembly techniques used to combine components from different sources, each having their own evolving design criteria, have increased. For example, increasing attention must be paid to the ways in which one component is mounted to another, taking into account the heat loadings of each component and the need for reliable communication of signals between the components.

At times, assemblies must accommodate factors arising from uses and practices unrelated to the assemblies themselves. For example, field servicing techniques and mass production assembly line techniques are sometimes investigated only after an initial design of the electronic components has been determined. Consideration of these later investigations may require a reiteration of an initial assembly design. For example, assembly techniques such as the initial mating of threaded components may be complicated when one of the components is spring-loaded to satisfy demands which may not have been present in the initial design of the assembly, such as that of accommodating a particular kind of the electrical connector. Further, as pointed out above, the electrical connector may have to be integrated with an assembly of massive components.

SUMMARY

The invention in one implementation encompasses an apparatus. The apparatus comprises a subassembly comprising a first body member, a bias member and a fastener extending through the subassembly for compression thereof. The apparatus further comprises a precompression member engageable with the subassembly and the bias member so as to impart a precompression force to the bias member.

Another implementation of the invention encompasses a method in which a subassembly of a bias member and a first body member and, thereafter, the subassembly is compressed with a fastener extending through the subassembly.

Another implementation of the invention encompasses an apparatus in which a subassembly comprises a bias member and a pair of body members carrying mating electrical connectors. The apparatus also comprises a fastener extending through and compressing the subassembly and a precompression member engageable with the subassembly and the bias member so as to impart a precompression force to the bias member.

Yet another implementation of the invention encompasses an apparatus. The apparatus comprises a first means for carrying a first electrical component, a bias means and a fastener means extendable through the first means and the bias means so as to form a subassembly and for applying a compression force to the subassembly. The apparatus further comprises a precompression means engageable with the subassembly and the bias means so as to precompress the bias means.

DESCRIPTION OF THE DRAWINGS

Features of exemplary implementations of the invention will become apparent from the description, the claims, and the accompanying drawings in which

FIG. 4 is a representation of a fragmentary elevational view of the apparatus of FIG. 1.

FIG. 5 is a representation of a cross-sectional view taken along the line 5-5 of FIG. 2.

FIG. 6 is a representation of an exploded view of FIG. 5.

FIG. 7 is a representation of a fragmentary portion of the apparatus of FIG. 1.

FIG. 8 is a representation of a fragmentary portion of the heat sink member and leaf spring of the apparatus of FIG. 1.

FIG. 9 is a representation of a cross-sectional view taken along the line 9-9 of FIG. 8.

FIG. 10 is a representation of fragmentary portions of the first and second component boards of the apparatus of FIG. 1.

DETAILED DESCRIPTION

Referring to the BACKGROUND section above, apparatus employing relatively massive components oftentimes require special assembly techniques in order to avoid or otherwise reduce the severity of problem conditions which may arise during the life cycle of the apparatus. Heat sinks are employed to conduct certain levels of substantially continuous thermal energy away from heat generating devices such as an integrated circuit, regardless of the implementation or function of the integrated circuit. For example, the integrated circuit may comprise a microprocessor of a computer system. One known design of an integrated circuit employs an outer housing or package for the integrated circuit microprocessor device that is relatively thin, compared to its footprint or size when viewed from above. Heat sinks oftentimes engage the upper surface of the microprocessor package to maximize the heat flow away from the microprocessor device. To maintain an acceptably low operating temperature of high-speed microprocessors, heat sinks have grown in mass. Components such as heat sinks must, at times, be integrated with other relatively massive components such as power supplies and/or voltage regulator circuits. It has become popular in certain arrangements for high value components such as microprocessors, to mount the component on a circuit board which can be assembled under controlled conditions and stored separately until integrated with the apparatus.

It is important that the electrical connectors employed for the various components of a commercial product be made reliable, despite the trend for increasing the density of electrical circuits while reducing the physical size of the electrical connector. One type of the electrical connector proposed for use in computers comprises a first connector having an array of contact pads and a second connector having an array of finger-like electrical terminals. Electrical connection between the connectors is established by pressing the connectors together with predetermined alignment and contact pressure being maintained by bias members exerting a relatively high force. At times, the electrical connectors, and circuit boards containing those electrical connectors, must be integrated with other components, and the overall assembly must be optimized with all the components accommodating the spring forces.

Figure 1:
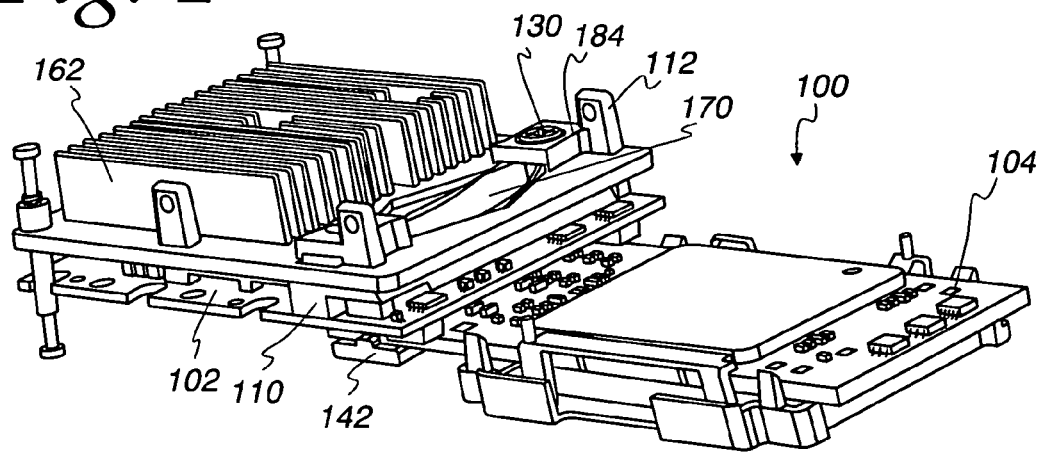
FIG. 1 is a representation of one implementation of an apparatus that comprises an assembly of a first and second component boards and first and second heat sink members.

Turning to FIG. 1, the invention in one implementation comprises an apparatus 100. In one example, apparatus 100 comprises an assembly of first and second body members or component boards and first and second heat dissipating members. In one example, the component boards comprise printed circuit boards 102, 104 carrying one or more heat generating electrical devices and the heat dissipating members comprise a heat spreader plate and a heat sink 112. In one example, the printed circuit board 104 receives a microprocessor (not shown) and the printed circuit board 102 contains a voltage regulator which supplies power to the microprocessor and its associated circuitry. In the example illustrated in the figures, the major portion of the microprocessor board 104 is cantilevered or located laterally adjacent the voltage regulator board 102 and is isolated from the heat generated by the components associated with the voltage regulator Board.

Figure 3:
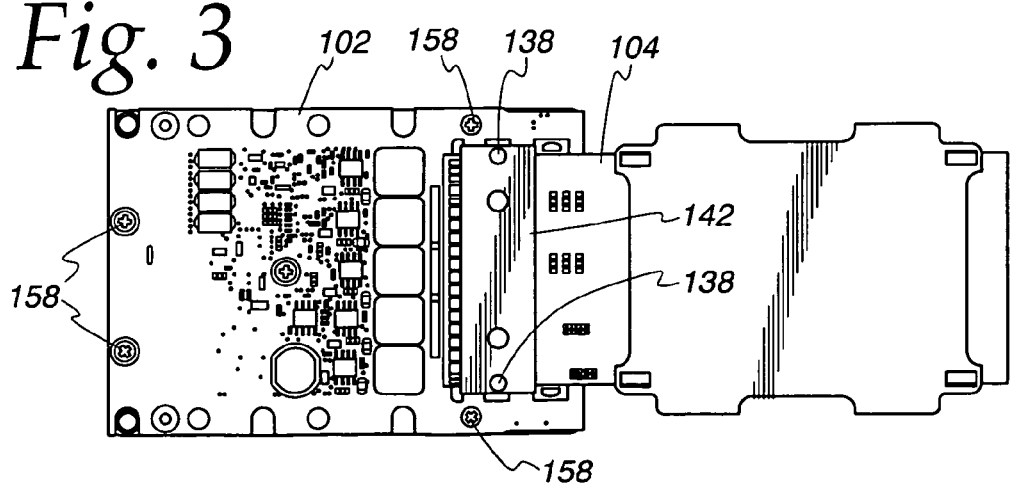
FIG. 3 is a representation of a bottom view of the apparatus of FIG. 1.

As can be seen in the bottom view of FIG. 3, relatively small portions of the voltage regulator board 102 and the microprocessor board 104 overlap one another. Referring briefly to FIG. 10, the overlapping portions of the voltage regulator board 102 and the microprocessor board 104 carry first and second mating electrical connectors 120, 122, respectively. In one example, the electrical connectors 120, 122 comprise relatively high density connectors of the surface contact type, with the electrical connector 122 comprising an array of contact terminals or contact pads arranged in a rectilinear grid pattern and the electrical connector 120 comprising an array of contact terminals or contact fingers arranged in a corresponding rectilinear grid pattern. Ohmic contact between the contact terminals of the connectors 120, 122 is established and maintained by forces normal to the connectors which press the contact terminals together. In one example, the arrays of contact terminals of each connector 120, 122 are generally planar, thus benefiting from an alignment which maintains the connectors 120, 122 parallel and tightly positioned one against the other. Intimate contact between the afore-described connectors 120, 122 is important due to the absence of pin-and-socket or other inter-mating engagements.

Turning now to FIGS. 4 and 5, the connectors carried on the voltage regulator board 102 and the microprocessor board 104 are held together in mating connection by a pair of threaded fasteners 130. In one example, the threaded fasteners comprise shoulder screws. As can be seen in FIG. 6, the shoulder screws 130 include an enlarged ahead 132 and an enlarged, but smaller shoulder portion 134, a smooth wall portion 136 and a tip 138 carrying external screw threads. The threaded tips 138 of the shoulder screws 130 threadingly engage a threaded plate or bolster plate 142. With reference to FIG. 3, bolster plate 142 overlays a small portion of the free end of microprocessor board 104, and the free ends 138 of shoulder screws 130 are received in threaded holes 146 formed in bolster plate 142 (see FIG. 6). The electrical contacts 120, 122 illustrated in FIG. 10 fit within the footprint of a bolster plate 142, shown in FIG. 3. Thus, contact-making and contact-maintaining pressure is formed along the axes of the shoulder screws 130, immediately adjacent the contact arrays. With reference to FIG. 10, in one example, holes 154 formed in voltage regulator board 102 receive the shoulder screws 130, as do notches 156 formed in the edges of microprocessor board 104.

Figure 2:
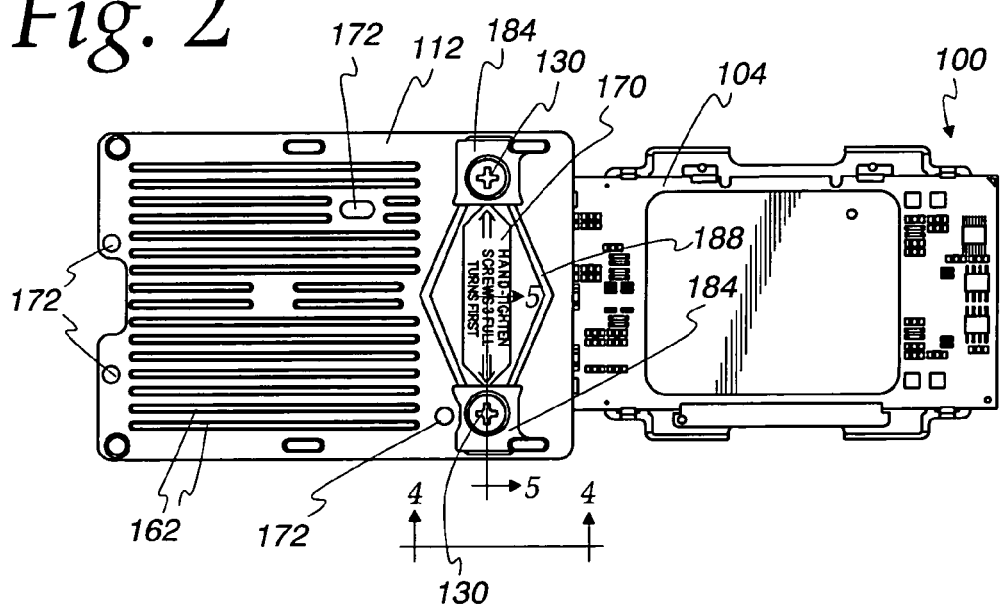
FIG. 2 is a representation of a top view of the apparatus of FIG. 1.

Turning now to FIGS. 3 and 7, voltage regulator board 102 is, in one example, secured to heat spreader plate 110 by a series of threaded fasteners 158 visible and FIG. 3. Heat spreader plate 110 is, in one example, formed of thermally conductive material such as aluminum or other metal. Heat spreader plate 110 is preferably maintained informal contact with heat-generating components carried by voltage regulator board 102. With reference to FIGS. 1, 2 and 7, heat sink 112, in one example, is formed of thermally conductive material such as aluminum. In another example, heat sink 112 is formed of a cast metal material so as to include a plurality of heat dissipating fins 162 visible for example in FIGS. 1 and 2. With reference to FIG. 7, in one example, heat spreader plate 110 and heat sink 112 have generally flat, opposed, planar mating surfaces 166, 168, respectively. In one example, the mating surfaces 166, 168 are of generally the same size. With reference to FIG. 2, heat spreader plate 110 and heat sink 112 are secured together with threaded fasteners or screws 172. When assembled together, heat spreader plate 110 and heat sink 112 in one example, comprise a unitary thermally conductive heat sink arrangement for drawing heat away from voltage regulator board 102 and the components carried thereon. It is therefore important in this exemplary arrangement, that the mating surfaces 166, 168 of the heat spreader plate and heat sink are in intimate contact with one another. At the same time, it is important that the contacts of electrical connectors 120, 122 are maintained in close, intimate contact with each other so as to maintain continuity of electrical signals traveling between voltage regulator board 102 and microprocessor board 104.

With reference to FIGS. 1, 2, 7-9 a bias member 170 is provided to maintain close intimate contact between the connectors 120, 122 with a controlled, predefined pressure. In one example, bias member 170 comprises a leaf spring and in another example comprises a leaf spring having the configuration of a curved plate. As illustrated in the figures, leaf spring 170 has a generally diamond shape when viewed in plan (see for example FIG. 8) and a rounded or curved shape when viewed on edge (see FIGS. 8 and 9). As can be seen for example in FIG. 8, mounting ears 174 having elongated holes for receiving shoulder screws 130 are located at opposed ends of the leaf spring 170. In one example, leaf spring 170 is struck from a flat plate of the spring material so as to have the shape and features described herein. With reference to FIG. 7, leaf spring 170 lies on top of the flat mating surface 166 of heat spreader plate 110. In the example described above, mating surfaces 166, 168 of heat spreader plate 110 and heat sink 112 are preferably maintained in intimate contact with one another, throughout. In order to accommodate leaf spring 170 and the upper portions of shoulder screws 130, heat sink 112 is provided with a recessed portion 180 visible in FIGS. 7 and 8 which, when viewed from above, (as in FIG. 1), comprises raised end portions 184 and a central opening 188. In one example, opening 188 as a truncated diamond shape as can be seen for example in FIG. 2. In one example, with reference to FIG. 7, holes 192 are formed in the raised portions of heat sink 112, on either side of central hole 188, to accommodate the enlarged heads 132 of shoulder screws 130. Accordingly, in the example provided, shoulder screws 130 can be accessed, and installed or removed if necessary after the heat spreader plate 110 and heat sink 112 are secured together. In one example, the relative size of leaf spring 170 requires the leaf spring to be received in recess 180 of heat sink 112 (see FIG. 7) prior to bringing the heat spreader plate and heat sink together.

With reference to FIGS. 8 and 9, leaf spring 170 is shown nested within recess 180 of heat sink 112, for explanatory purposes. It can be seen from FIGS. 8 and 9 that the bowing or curvature of leaf spring 170 is such that the leaf spring has a greater height than the depth of recess 180. Accordingly, when assembly is made as indicated in FIG. 7, leaf spring 170 is in its undeflected state, and interferes with the mating of opposed surfaces 166, 168 of heat spreader plate 110 and heat sink 112. Accordingly, in the example given herein, leaf spring 170 must be precompressed a certain amount to allow the mating engagement of opposed planar surfaces 166, 168. Precompression, in one example, is provided by drawing heat sink 112 toward the heat spreader plate 110 by screws 172 (see FIG. 2). Accordingly, heat sink 112 cooperates with the heat spreader plate 110 to function as a precompression member, engaging leaf spring 170 and applying pressure to the leaf spring to provide a precompression thereof. During this operation, the shoulder screws 130 are inserted through the leaf spring 170 and the joined assembly of heat spreader plate 110 and voltage regulator board 102. Alternatively, the shoulder screws 130 may be omitted during the precompression step when the heat sink 112 is advanced toward heat spreader plate 110 by screws 172. As the heat sink 112 and heat spreader plate 110 are brought into intimate engagement with one another, the pocket portions or raised end portions 184 of heat sink 112 engage the ends of the downwardly curved leaf spring 170 (as can be seen in FIG. 8), while the central curvature of leaf spring 170 engages mating surface 166 of heat spreader plate 110 (see FIG. 7). As can be seen in FIG. 8, leaf spring 170 is held by the pocket portion of the heat sink 112 in a controlled position during precompression. Accordingly, an arrangement is provided in apparatus 100 to form a controlled positioning and precompression of leaf spring 170.

With reference to FIGS. 5 and 6, shoulder screw 130 is inserted through the illustrated subassembly of components comprising the first and second circuit boards 102, 104, the leaf spring 170 and the first and second heat dissipating members which include the heat sink 112 and heat spreader plate 110. With further compression of leaf spring 170 upon tightening the shoulder screws 130, the desired amount of compression mating force for electrical contacts 120, 122 (see FIG. 10) is provided. In one example, leaf spring 170 ensures that the compressive force applied to contacts 120, 122 is controlled, that is, limited to a desired value. In another example, the initial mating of connectors 120, 122 is allowed to proceed without interference by bias forces applied to shoulder screws 130 by leaf spring 170.

In one example, shoulder screws 130 are provided with a length sufficient to allow clearance between bolster plate 142 and the contact that 120 carried on voltage regulator board 102. In another example, a length of shoulder screw 130 must be maintained as short as possible, providing only a few threads of engagement between the bottom of the shoulder screw and the threaded bore 146 of bolster plate 142. In such instances, it is important that provision be made for the adequate precompression of leaf spring 170 without interfering with assembly operations. Accordingly, bolster plate 142 is, in one example, removed to allow mating of connector 122 of microprocessor board 104 to connector 120 of voltage regulator board 102.

Referring again to FIGS. 5 and 6, hollow core bushings 200 provide alignment and stand-off support for electrical contacts 120, 122. As can be seen in FIG. 6, bushings 200 include an upper end with an enlarged head 202 and an internal threaded portion 204. The outer surface of bushings 200 is smooth, as is the lower portion of its internal bore. As can be seen with reference to FIG. 5 (and with comparison to FIG. 6), the enlarged head of bushing 200 seats against the upper surface of voltage regulator board 102 and extends through the connector attached thereto, and also through microprocessor board 104, with the lower end of bushing 200 seated against bolster plate 142. As shown in FIG. 6, the threaded bore 146 of bolster plate 142 is associated with an upwelling which seats adjacent, or in one example within, the inner bore of bushing 200 to provide alignment of the components at the lower end of the assembly portion shown in FIG. 5. Bushing 200 is dimensioned for a relatively tight, close tolerance fit with voltage regulator board 102, connector 120 and microprocessor board 104. In one example, connector 120, which contains delicate finger like contact elements include stop members (not shown) which prevent crushing of the contact elements. In another example, bushing 200 helps to prevent the fingerlike elements of contact 120 from being crushed by the enlarged body or shoulder portion 134 of shoulder screw 130 (see FIG. 6), which seats against the enlarged head 202 of bushing 200.

An illustrative description of exemplary operation of the apparatus 100 is presented, for explanatory purposes. It will be appreciated that various assembly procedures may be employed in constructing the apparatus 100. In one example, heat spreader plate 110 and voltage regulator board 102 are secured together, after inserting leaf spring 170 and bushings 200 in the manner indicated in FIG. 5. The microprocessor board 104 is then positioned with respect to the free ends of bushings 200 and bolster plate 142 is seated in position with respect to the microprocessor board and the free ends of bushings 200. In one example, an insulator strip of plastic or other dielectric material (not shown) is snapped onto bolster plate 142. The insulator strip also contains snap lock features for engaging microprocessor board 104, thus securing bolster plate 142 to the microprocessor board 104. In another example, the insulator strip is omitted and bolster plate 142 is held in desired position with regard to microprocessor board 104, during assembly.

The shoulder screws 130 are inserted through the leaf spring, heat spreader plate 110, bushings 200 and voltage regulator board 102. In so doing, the lower threaded end 138 of shoulder screws 130 must be threadingly mated with the internal bore of bushings 200 to achieve passage therethrough. In one example, shoulder screw 130 is dimensioned such that the threaded engagement of its lower end 138 with the internal threads 204 of bushing 200 achieves the aforementioned precompression of leaf spring 170. Heat sink 112 and heat spreader plate 110 are then joined together in the manner described above with reference to FIG. 2, using screws 172. In this example, where precompression is provided by the threaded engagement of shoulder screw 130 with bushing 200, threaded engagement of screws 172 with heat spreader plate 110 can be initiated without interference from forces of leaf spring 170.

With passage of the bottom end 138 of shoulder screw 130 through voltage regulator board 102 and microprocessor board 104, bolster plate 142 is then threadingly engaged with the bottom threaded end 138 of shoulder screw 130. It has been found important, in certain instances, to prevent interference to this initial threaded engagement which may be caused by leaf spring 170. Accordingly, in one example, precompression of leaf spring 170 is provided as described herein, (for example, by securing the mated joinder of heat sink 112 to heat spreader 110), rather than by engaging the threaded end 138 of shoulder screw 130 with bolster plate 142 while pushing against leaf spring 170 to accomplish its precompression. A further advantage is obtained according to one example of the present invention by providing a precompression of leaf spring 170 with a rigid member (i.e. heat sink 112) which spans both ends of the leaf spring, so as to impart precompression forces to both ends of the leaf spring, at the same time. Preferably, the precompression forces applied to both ends of the leaf spring 170 are approximately equal to one another. However, even if the forces applied to both ends of leaf spring 170 are unequal, advantages are still obtained over prior art assembly techniques in which precompression is applied by engaging, and then iteratively and incrementally advancing threaded fasteners at each end of the leaf spring. In the prior art assembly techniques mentioned herein, threaded fasteners at each end of the leaf spring could not be made to engage a mating threaded member (such as bolster plate 142) simultaneously. Rather, one threaded fastener at one end of leaf spring would be made to initially engage the mating threaded member, with a limited amount of engagement. If the amount of engagement of the first threaded fastener with the mating threaded member was not carefully limited, initial engagement of the second threaded fastener would be complicated and prone to cross threading since the spring forces needed to be overcome by the second threaded fastener would be increased substantially. Rather, in prior art assembly techniques, the first threaded fastener must be only partially engaged, then the second threaded fastener would be partially engaged, then the first threaded fastener is engaged a little bit more, with the second threaded fastener being engaged a little bit more—and so forth, with a see-saw action back-and-forth between the first and the second threaded fasteners. With assemblies according to principles of the present invention, the need for sequencing of the torquing of the screws at each end of the leaf spring is virtually eliminated. In one example, as described above, heat sink 112 is advanced toward leaf spring 170 so as to overlie heat spreader 110. A plurality of threaded fasteners 172, in the example given with reference to FIG. 2, secure heat sink 112 to heat spreader 110 thereby compressing the spring 170 with a controlled precompression. In the example given, because of the relative shape, dimensions and mass of heat sink 112 compared to leaf spring 170, a torque sequencing is not required to easily and reliably thread the fasteners 172 in a manner which provides precompression of leaf spring 170. With the exemplar arrangement described herein, one of the fasteners 172 can be fully tightened, even before the other fasteners 172 are initially threaded. This allows for a relatively softer leaf spring (or other bias member) to be used to decrease the effects of thickness tolerance variation on the load, since the bias member can be made to undergo a greater precompression deflection, thus requiring lesser travel of the fasteners which provide final compression of the bias member (herein, the shoulder screws 130).

In one example, once initial threaded engagement between shoulder screw 130 and bolster plate 142 is achieved, attention is then turned to increasing the compression of leaf spring 170, with further rotation of shoulder screw 130. Shoulder screw 130 is tightened to the point of desired deflection of leaf spring 170, thus determining the contact pressure between contacts 120, 122 of the voltage regulator board 102 and microprocessor board 104, respectively. In one example, leaf spring 170 requires between 40 and 50 pounds of pressure to achieve full deflection. With precompression in the manner described herein, the pressure loading required to achieve full compression of leaf spring 170 is reduced to a value of ranging between 20 and 30 pounds of pressure.

The apparatus 100 in one example comprises a plurality of components such as one or more of electronic components, and hardware components. A number of such components can be combined or divided in the apparatus 100. The apparatus 100 in one example comprises any (e.g., horizontal, oblique, or vertical) orientation, with the description and figures herein illustrating one exemplary orientation of the apparatus 100, for explanatory purposes. Also, printed circuit boards have been described in the examples given above. The present invention also contemplates other types of bodies which are compressed together using one or more fasteners passing through the bodies. Furthermore, and other examples given herein electrical connectors are carried on their respective circuit board. The present invention contemplates electrical connectors which are carried on bodies other than circuit boards and which may even a stand alone in certain instances. As mentioned above, in examples provided, mating electrical connectors have terminals which comprise contact pads and contact fingers which are pressed into contact one with the other. The present invention also contemplates other types of electrical connections, such as those of contact plates or washers as well as known pin-and-socket arrangements.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus comprising:
   a subassembly comprising a first body member and a bias member;
   a fastener extending through the subassembly for compression thereof; and
   a precompression member engageable with the subassembly and the bias member so as to impart a precompression force to the bias member, wherein the precompression member comprises a heat sink and a heat spreader, and wherein the heat sink has a plurality of heat dissipating fins, and wherein the heat sink and the heat spreader have flat, opposed, planar mating surfaces of a same size which are secured together in close contact with threaded fasteners, wherein the bias member comprises a double-ended leaf spring, the heat sink defines a recess for receiving at least a portion of the leaf spring, the heat sink comprises a raised pocket portion adjacent the recess and engaging the ends of the leaf spring so as to impart a precompression force thereto when the heat sink and heat spreader are mated together.

2. The apparatus of claim 1 wherein the first body member comprises a circuit board carrying a heat generating electrical device.

3. The apparatus of claim 1 wherein the subassembly further comprises a second body member, with the fastener extending through the second body member.

4. The apparatus of claim 1 wherein:
the first body member carries a first electrical connector,
the subassembly further comprises a second body member carrying a second electrical connector, with the fastener extending through the first and the second body members to apply a compressive mating force to the first and the second electrical connectors.

5. The apparatus of claim 4 wherein at least one of the first and the second body members carries a heat generating electrical device.

6. The apparatus of claim 4 wherein the first and the second body members comprise first and second circuit boards.

7. The apparatus of claim 6 wherein the at least one of the first and the second circuit boards carry one or more electrical components that generate heat.

8. The apparatus of claim 1 wherein the bias member comprises a double-ended leaf spring.

9. The apparatus of claim 8 wherein the precompression member comprises a substantially rigid body engaging both ends of the leaf spring so as to impart precompression forces thereto at substantially the same time.

10. The apparatus of claim 9 wherein the precompression member comprises a plate defining a pocket for partially receiving both ends of the leaf spring, and the subassembly further comprises a substantially rigid body member, with the leaf spring precompressed between the pocket and the substantially rigid body member.

11. The apparatus of claim 9 wherein the precompression member comprises a mated joinder of the heat sink and the heat spreader.

12. The apparatus of claim 11 wherein the fastener engages one end of the leaf spring and the apparatus further comprises a second fastener engaging the other end of the leaf spring.

13. The apparatus of claim 12 wherein the leaf spring is disposed between the heat sink and the heat spreader.

14. The apparatus of claim 13 wherein the recess is dimensioned so as to partially compress the leaf spring when mated to the heat spreader.

15. The apparatus of claim 14 wherein the raised portion defines holes for receiving the first and the second threaded fasteners.

16. The apparatus of claim 15 wherein the first and the second threaded fasteners comprise screws and the apparatus further comprises a threaded plate engageable with the screws so as to impart compressive forces to the subassembly.

17. The apparatus of claim 1 wherein the heat spreader is formed of aluminum.

18. The apparatus of claim 1 wherein the heat sink is formed of a cast metal material.

19. An apparatus comprising:
a subassembly comprising a bias member and a pair of body members carrying mating electrical connectors;
a fastener extending through and compressing the subassembly; and
a precompression member engageable with the subassembly and the bias member so as to impart a precompression force to the bias member, wherein the precompression member comprises a heat sink and a heat spreader, and wherein the heat sink has a plurality of heat dissipating fins, and wherein the heat sink and the heat spreader have flat, opposed, planar mating surfaces of a same size which are secured together in close contact with threaded fasteners, wherein the bias member comprises a double-ended leaf spring, the heat sink defines a recess for receiving at least a portion of the leaf spring, the heat sink comprises a raised pocket portion adjacent the recess and engaging the ends of the leaf spring so as to impart a precompression force thereto when the heat sink and heat spreader are mated together.

20. The apparatus of claim 19 wherein one electrical connector comprises a plurality of contact pads and the other electrical connector comprises a plurality of contact fingers engageable with respective ones of the contact pads.

21. An apparatus comprising:
a first means for carrying a first electrical component;
a bias means;
a fastener means extendable through the first means and the bias means so as to form a subassembly and for applying a compression force to the subassembly; and
a precompression means engageable with the subassembly and the bias means so as to precompression the bias means, wherein the precompression means comprises a heat sink and a heat spreader, and wherein the heat sink has a plurality of heat dissipating fins, and wherein the heat sink and the heat spreader have flat, opposed, planar mating surfaces of a same size which are secured together in close contact with threaded fasteners, wherein the bias means comprises a double-ended leaf spring, the heat sink defines a recess for receiving at least a portion of the leaf spring, the heat sink comprises a raised pocket portion adjacent the recess and engaging the ends of the leaf spring so as to impart a precompression force thereto when the heat sink and heat spreader are mated together.

22. The apparatus of claim 21 wherein the subassembly further comprises a second means for carrying a second electrical component and having means for receiving the fastener means.

23. The apparatus of claim 22 wherein the first and the second means carry respective mating electrical connectors in electrically engageable with one another with application of a compression force provided by a cooperation of the fastener means and the bias means.

24. The apparatus of claim 23 wherein the bias means comprises a leaf spring and the precompression means comprises a precompression body member with a pocket portion defining a recess for receiving a portion of the leaf spring.

25. The apparatus of claim 24 wherein the subassembly further comprises a plate means secured to one of the first and the second means, the precompression body member comprises heat sink means and the leaf spring is disposed between the heat sink and the plate means.

* * * * *

UNITED STATES PATENT AND TRADEMARK OFFICE
CERTIFICATE OF CORRECTION

| | |
|---|---|
| PATENT NO. | : 7,567,438 B1 |
| APPLICATION NO. | : 11/151763 |
| DATED | : July 28, 2009 |
| INVENTOR(S) | : Stephan Karl Barsun et al. |

Page 1 of 1

It is certified that error appears in the above-identified patent and that said Letters Patent is hereby corrected as shown below:

In column 3, line 24, after "plate" insert -- 110 --.

Signed and Sealed this

Fifth Day of January, 2010

David J. Kappos
*Director of the United States Patent and Trademark Office*